(12) United States Patent
Wu

(10) Patent No.: US 11,043,936 B1
(45) Date of Patent: Jun. 22, 2021

(54) TUNING METHOD FOR CURRENT MODE RELAXATION OSCILLATOR

(71) Applicant: MACRONIX INTERNATIONAL CO., LTD., Hsinchu (TW)

(72) Inventor: Hsien-Hung Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/833,270

(22) Filed: Mar. 27, 2020

(51) Int. Cl.
| H03K 3/0231 | (2006.01) |
| H01L 29/94 | (2006.01) |
| H03K 3/011 | (2006.01) |
| H03K 4/501 | (2006.01) |

(52) U.S. Cl.
CPC .......... *H03K 3/0231* (2013.01); *H01L 29/94* (2013.01); *H03K 3/011* (2013.01); *H03K 4/501* (2013.01)

(58) Field of Classification Search
CPC ........ H03K 3/0231; H03K 4/50; H03K 4/501; H03K 4/502; H03K 3/011; H03B 5/24
See application file for complete search history.

(56) References Cited

U.S. PATENT DOCUMENTS

| 4,623,851 | A | 11/1986 | Abou |
| 5,347,224 | A | 9/1994 | Brokaw |
| 5,838,183 | A | 11/1998 | Ishizaka |
| 5,859,571 | A * | 1/1999 | Lee ................. G11C 11/5628 331/111 |
| 6,092,217 | A | 7/2000 | Kanekawa et al. |
| 6,184,704 | B1 | 2/2001 | Wang et al. |
| 6,356,161 | B1 | 3/2002 | Nolan et al. |
| 6,434,707 | B1 | 8/2002 | Eklof |
| 6,854,068 | B2 | 2/2005 | Ishibe et al. |
| 6,933,754 | B2 | 8/2005 | Restle |
| 7,075,353 | B1 | 7/2006 | Wan et al. |
| 7,142,005 | B1 | 11/2006 | Gaboury |

(Continued)

FOREIGN PATENT DOCUMENTS

TW 476190 B 2/2002

OTHER PUBLICATIONS

Chiang et al. "A Submicrowatt 1.1-MHz CMOS Relaxation Oscillator With Temperature Compensation," IEEE Transactions on Circuits an Systems II: Express Briefs, vol. 60, Issue 12, Dec. 2013 pp. 837-841.

(Continued)

*Primary Examiner* — Ryan Johnson
(74) *Attorney, Agent, or Firm* — Haynes Beffel & Wolfeld LLP

(57) ABSTRACT

A relaxation oscillator includes an adjustable reference circuit generator to produce a reference current which is applied to a charging circuit. The charging circuit is configured to charge a capacitive node as a function of the reference current and a capacitance of an adjustable capacitor that is operably coupled to the capacitive node. A comparator having inputs operatively coupled to a reference voltage node and to the capacitive node, generates a comparator output. A control circuit alternatively enables the charging circuit to charge the capacitive node and to discharge the capacitive node in response to changes in the comparator output. Also, the control circuit outputs and oscillator output signal have an oscillator period as a function of the adjustable capacitance and the adjustable reference current.

16 Claims, 8 Drawing Sheets

(56) References Cited

U.S. PATENT DOCUMENTS

| | | | |
|---|---|---|---|
| 7,558,390 B2 | 7/2009 | Nielsen et al. | |
| 7,656,145 B2 | 2/2010 | Xiao et al. | |
| 7,800,454 B2 * | 9/2010 | Vanselow | H03K 3/011 |
| | | | 331/360 |
| 7,932,639 B2 | 4/2011 | Ma et al. | |
| 7,961,027 B1 | 6/2011 | Chen et al. | |
| 8,148,967 B2 | 4/2012 | Xing et al. | |
| 8,217,698 B2 | 7/2012 | Chen et al. | |
| 8,245,074 B2 | 8/2012 | Chen et al. | |
| 8,261,120 B2 | 9/2012 | Chen et al. | |
| 8,589,716 B2 | 11/2013 | Chen et al. | |
| 8,665,029 B2 * | 3/2014 | Tseng | H03K 3/0231 |
| | | | 331/111 |
| 8,736,331 B2 | 5/2014 | Chen | |
| 8,742,858 B2 * | 6/2014 | Nonis | H03K 3/011 |
| | | | 331/111 |
| 8,819,473 B2 | 8/2014 | Chen et al. | |
| 9,270,272 B2 | 2/2016 | Chen et al. | |
| 9,876,502 B2 | 1/2018 | Chen et al. | |
| 10,454,479 B2 | 10/2019 | Chen et al. | |
| 10,637,476 B2 | 4/2020 | Chen et al. | |
| 2002/0199125 A1 | 12/2002 | Chieco et al. | |
| 2008/0100391 A1 | 5/2008 | Lim et al. | |
| 2008/0278124 A1 | 11/2008 | Aiura et al. | |
| 2009/0160410 A1 | 6/2009 | Ai-Shyoukh et al. | |
| 2010/0270997 A1 | 10/2010 | Riedel | |
| 2011/0291638 A1 | 12/2011 | Chen | |
| 2018/0091096 A1 * | 3/2018 | Wu | H03B 5/24 |
| 2018/0351538 A1 | 12/2018 | Tanaka et al. | |
| 2019/0199330 A1 * | 6/2019 | Roy | H03K 3/011 |

OTHER PUBLICATIONS

V. Ivanov and I. M. Filanovsky, Operational amplifier speed and accuracy improvement, Book, MA: Kluwer, 2004, Chapter 3, pp. 37-48.

TW Office Action from Application No. 10920923430 dated Sep. 25, 2020, 8 pages.

U.S. Office Action in U.S. Appl. No. 16/842,068 dated Nov. 6, 2020, 11 pages.

Wikipedia, "Process corners," Apr. 3, 2019, 3 pages.

* cited by examiner $$T_{CMP} = C_{D1} \times \left( \frac{V_{th}}{I_{REF}} + \frac{1}{\sqrt{(\beta \times I_{REF})}} \right)$$

where $C_{D1}$ is the total capacitance at $D1$.

where $\beta = \mu C_{ox} W / 2L$.

TUNING METHOD FOR CURRENT MODE RELAXATION OSCILLATOR

BACKGROUND

Field

The present invention relates to tunable oscillators, including relaxation oscillators, including oscillators used in clock circuits for integrated circuits.

Description of Related Art

Integrated circuit products often include oscillators used to generate clock signals. One type of oscillator is known as the relaxation oscillator, an example of which is described in Chang, et al., "A Submicrowatt 1.1-MHz Relaxation Oscillator With Temperature Compensation", IEEE TRANSACTIONS ON CIRCUITS AND SYSTEMS—II: EXPRESS BRIEFS, Vol. 60, No. 12, December 2013, pages 837-841.

Known approaches to relaxation oscillators have poor flexibility with regard to tuning the output period (or frequency), while maintaining temperature compensation by which a stable output period is generated across a range of operating temperatures.

It is desirable to provide an oscillator suitable for integrated circuits, which is tunable with precision and with a low temperature coefficient across a significant frequency range.

SUMMARY

An oscillator circuit suitable for generating clock signals on an integrated circuit is described, tunable across a substantial range of clock periods with good precision, at least some embodiments of which maintain stable output across a range of operating temperatures.

An oscillator described herein includes an adjustable reference circuit generator to produce a reference current which is applied to a charging circuit. The charging circuit is configured to charge a capacitive node as a function of the reference current and a capacitance of an adjustable capacitor that is operably coupled to the capacitive node. A comparator having inputs operatively coupled to a reference voltage node and to the capacitive node generates a comparator output. A control circuit alternatively enables the charging circuit to charge the capacitive node and to discharge the capacitive node in response to changes in the comparator output. Also, the control circuit outputs an oscillator output signal have an oscillator period that is a function of the adjustable capacitance and the adjustable reference current.

In some embodiments of the oscillator circuit, there are two capacitive nodes and two comparators which are operated out of phase and in coordination with the control circuit to generate the oscillator output.

The control circuit can be coupled with a control register storing parameters used to tune the oscillator, including a digital parameter for example, which sets the state of the adjustable capacitor, and the magnitude of the adjustable reference current.

An embodiment is described in which the capacitance of the adjustable capacitor has a first state for oscillator periods in a first range, and a second state for oscillator periods in a second range. In cooperation with the adjustable reference current, the oscillator period can be tuned across the first and second ranges with a step size in output period for each step in digital values of a control parameter used to set the output period, where the step size is more uniform across the first and second ranges, than step sizes in comparable systems without the adjustable capacitor.

Embodiments are described in which the adjustable capacitor comprises a switchable MOS capacitor, having a first capacitance in a first state, and a second capacitance in a second state.

Also, embodiments are described in which the adjustable reference current generator and the control circuit have respective temperature coefficients, and the temperature coefficient of the adjustable reference current generator offsets the temperature coefficient of the control circuit, tending to result in an output oscillator period that is stable, and varies only slightly, across the operating temperature range.

Other aspects and advantages of the present invention can be seen on review of the drawings, the detailed description and the claims, which follow.

DETAILED DESCRIPTION

A detailed description of embodiments of the present invention is provided with reference to the FIGS. 1-14.

Figure 1:
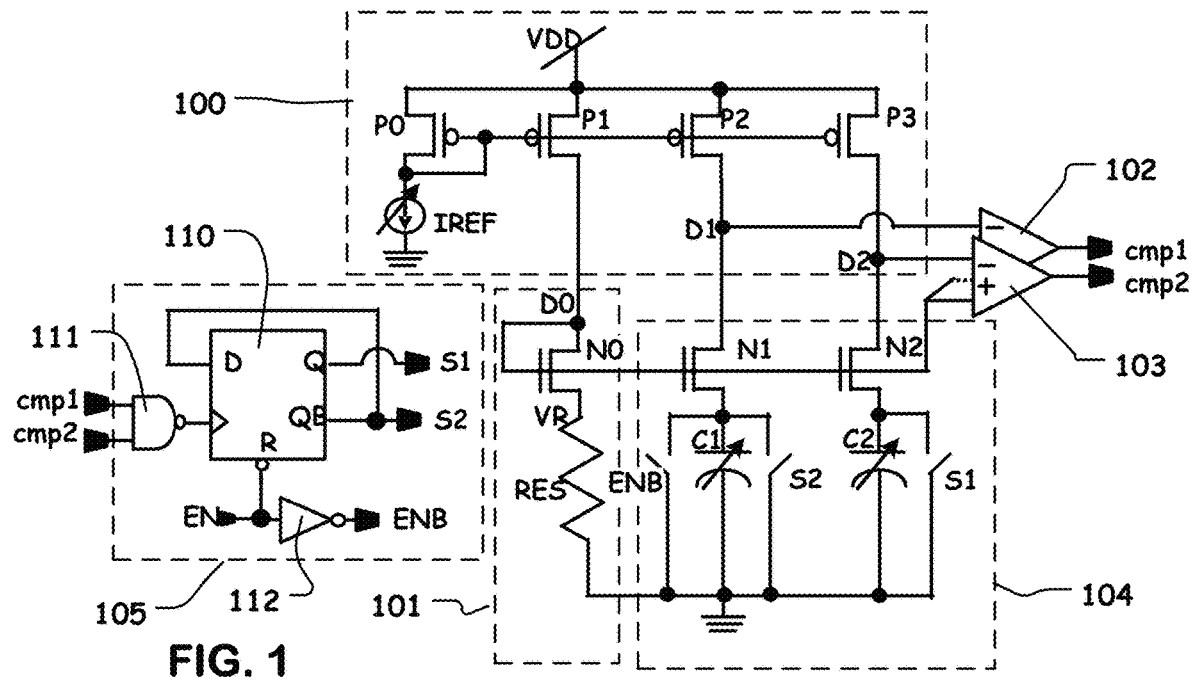
FIG. 1 is a schematic diagram of a current mode, relaxation oscillator circuit having a tunable output period.

FIG. 1 is a schematic diagram of a relaxation oscillator which is tunable over a wide range of output periods, embodiments of which can be stable over a wide operating range of temperatures.

In the embodiment of FIG. 1, the relaxation oscillator includes an adjustable reference current generator 100, a reference voltage generator 101 which generates a first reference voltage VR and a second reference voltage D0, a charging circuit 104 including adjustable capacitors C1 and C2 configured to charge and discharge two capacitive nodes as a function of the reference current and capacitance of adjustable capacitors C1 and C2, and a control circuit 105 to alternately enable the charging circuit to charge and discharge the capacitive nodes in response to the changes in the outputs of the two comparators, and to provide an oscillator output signal which has a frequency and a period is variable as a function of the adjustable capacitance and the adjustable reference current.

The adjustable reference current generator 100 includes p-channel MOS transistors P0 to P3 arranged in a current mirror configuration. Transistor P0 has a drain coupled to an adjustable reference current IREF and a source coupled to a supply voltage VDD. The gate and drain of transistor P0 are connected together, and to the gates of each of the transistors P1 to P3. Each of the transistors P1 to P3 mirrors a current on a respective output of the adjustable reference current generator that is a function of their sizes relative to the size of transistor P0.

The reference voltage generator 101 is coupled to the output of the adjustable reference current generator 100 driven by transistor P1. The reference voltage generator 101 includes an n-channel MOS transistor N1, which has its gate and drain coupled to the node D0 at the drain of transistor P1, and has its source connected through a resistor RES to VSS (in the examples herein VSS is ground, but it can be another reference voltage level). As a result, a constant voltage is generated at node D0, that is equal to the voltage VR across the resistor RES plus the threshold voltage of transistor N0.

The charging circuit 104 includes a first capacitive node D1 and a second capacitive node D2, at the drains of transistors P2 and P3, respectively, which drive outputs of the adjustable reference current generator 100.

The first capacitive node D1 is connected through a transistor N1 to a first terminal of an adjustable capacitor C1, the second terminal which is coupled to VSS. The transistor N1 has its gate connected to the reference voltage at node D0. The source of transistor N1, and the first terminal of the adjustable capacitor C1, are connected via a first switch controlled by an enable signal ENB which connects or disconnects the first terminal of the adjustable capacitor C1 to VSS. Also, the source of the transistor N1 and the first terminal of the adjustable capacitor C1 are connected via a second switch controlled by a first control signal S2 which connects or disconnects the first terminal of the adjustable capacitor C1 to VSS.

The second capacitive node D2 is connected through a transistor N2 to a first terminal of an adjustable capacitor C2, the second terminal of which is coupled to VSS. The transistor N2 has its gate connected to the reference voltage at node D0. The source of transistor N2, and the first terminal of the adjustable capacitor C2, are connected via a third switch controlled by a second control signal S1 which connects or disconnects the first terminal of the adjustable capacitor C2 to VSS.

A first comparator 102 has a first input connected to the first capacitive node D1 and a second input connected to the reference voltage at node D0. A second comparator 103 has a first input connected to the second capacitive node D2, and a second input connected to the reference voltage at node D0. The outputs cmp1 and cmp2 of the first and second comparators 102, 103 are supplied as inputs to a control circuit 105.

In this embodiment, the control circuit 105 comprises a D flip-flop 110, a NAND gate 111, and an inverter buffer 112. Comparator outputs cmp1 and cmp2 are supplied as inputs to the NAND gate 111. The output of the NAND gate 111 is applied to the clock input of the D flip-flop 110. The D input of the D flip-flop 110 is connected to the inverted output QB of the D flip-flop 110. The output Q of D flip-flop 110 is the control signal S1. The inverted output QB of the D flip-flop 110 is the control signal S2. The reset input of the D flip-flop 110 is driven by an enable signal EN. The input of the inverter buffer 112 is the enable signal EN, and its output is the enable signal ENB.

In this circuit, elements are connected between a supply potential VDD and VSS. It will be understood that in other embodiments, the supply potential and VSS could be replaced by any suitable power supply voltage and reference voltage. For example, a VSS reference voltage node can be connected to a DC ground. In other embodiments the VSS reference voltage node can be connected to AC ground. In other embodiments the VSS reference voltage node can be connected to other voltage references having relative voltage levels that are determined according to the supply voltage level and other aspects of particular embodiments. See for example, U.S. Pat. No. 9,876,502, entitled CLOCK INTEGRATED CIRCUIT, issued Jan. 23, 2018, by Chen et al., which application is incorporated by reference as if fully set forth herein.

Figure 2A:
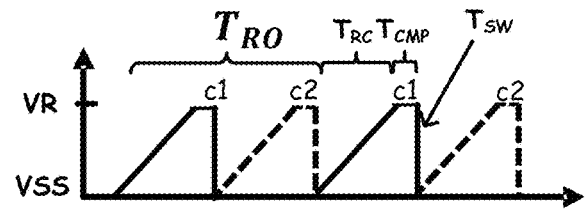
FIGS. 2A, 2B and 2C are timing diagrams for the oscillator circuit shown in FIG. 1.
Figure 2B:
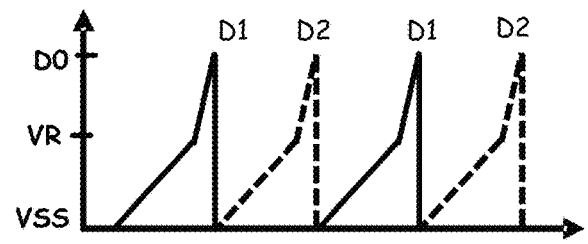
Figure 2C:
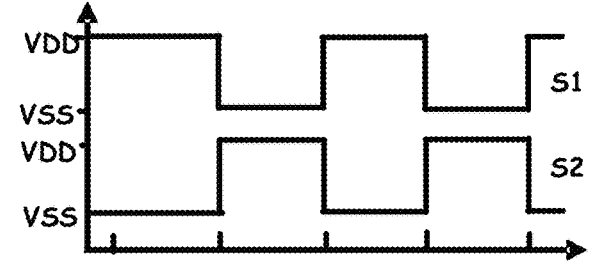

Operation of the circuit of FIG. 1 can be understood with reference to FIGS. 2A-2C, in which FIG. 2A illustrates the voltage on the adjustable capacitors C1 and C2 versus time, FIG. 2B illustrates the voltage is on the capacitive nodes D1 and D2 versus time, and FIG. 2C illustrates the timing of the control signals S1 and S2.

In the sequence illustrated in FIGS. 2A-2C, the control signals S1 and S2 began at VDD and VSS respectively, and C1, C2, D1 and D2 are all at VSS. When the enable signal EN is asserted, ENB goes low which turns off the ENB switch. This allows the node D1 to charge up as the adjustable reference current through P2 ramps up the voltage across the adjustable capacitor C1. The voltage at node D1 is clamped at a level about VR as a result of the transistor N1 gate voltage. The voltage at node D1 continues to increase until it crosses the level D0 as indicated by the output cmp1 of the first comparator 102. When cmp1 goes high, the output of the NAND gate 111 transitions causing the flip-flop to clock the value at QB, which induces a transition in the signals S1 and S2. When S1 goes low the third switch coupled to the adjustable capacitor C2 opens, and when S2 goes high, the second switch coupled to the adjustable capacitor C1 closes grounding the first terminal of the adjustable capacitor C1.

Thus, the voltage at node D1 is held at VSS, while the voltage at node D2 ramps up as illustrated in FIG. 2A. Likewise, the voltage at node D1 is grounded causing cmp1 to switch low, while the voltage at node D2 ramps up. Node D2 ramps up until voltage crosses the reference voltage at node D0, at which point the second comparator 103 causes a transition on the signal cmp2. This transition clocks the D flip-flop again, causing transitions in the control signals S1 and S2 to start a next cycle. This continues until the enable signal EN goes low.

The signal on one or both of the Q and QB outputs of the D flip-flop 110 are an output clock signal having a clock period $T_{RO}$ that is a function of the adjustable reference current IREF, and the capacitance of the adjustable capacitors C1 and C2.

In this embodiment, the duty cycle of the clock is 50%, which results from configuration of the adjustable capacitors and the comparators so that the charging and discharging occurs at substantially the same speeds on both sides of the circuit. In other embodiments, different duty cycles can be implemented using imbalanced capacitors and/or comparators. Also, in some embodiments, a relaxation oscillator can operate relying on a single capacitive node.

The rate of charging of the capacitive nodes D1 and D2 is a function of the currents on the current mirror outputs driven by transistors P2 and P3, which in turn mirror the adjustable reference current IREF, which is adjustable to tune the period of the output clock signal. Also, the rate of charging of the capacitive nodes D1 and D2 is a function of the capacitance of the adjustable capacitors C1 and C2, which are adjustable to tune the period of the output clock signal.

An adjustable reference current generator, and adjustable capacitors are utilized in combination in the embodiment shown, in a manner which allows for a broad tuning range and small temperature coefficient.

The clock period $T_{RO}$ can be characterized as based on the sum of the time $T_{RC}$ required to charge nodes D1 or D2 to VR while the transistor N1 or N2 operates in a linear mode, plus the time $T_{CMP}$ to charge nodes D1 and D2 from VR to D0 while the transistors N1 or N2 are in saturation, plus the switching time $T_{SW}$ for transition of the control signals cmp1, cmp2, S1 and S2. In this embodiment, the charging circuit is set to operate with a 50% duty cycle, so the delay in the charging cycle for adjustable capacitor C1 is the same as the delay in the charging cycle of adjustable capacitor C2, so the period of the output signal $T_{RO}$ is equal to twice the sum of $T_{RC}$, $T_{CMP}$ and $T_{SW}$.

Figure 3:
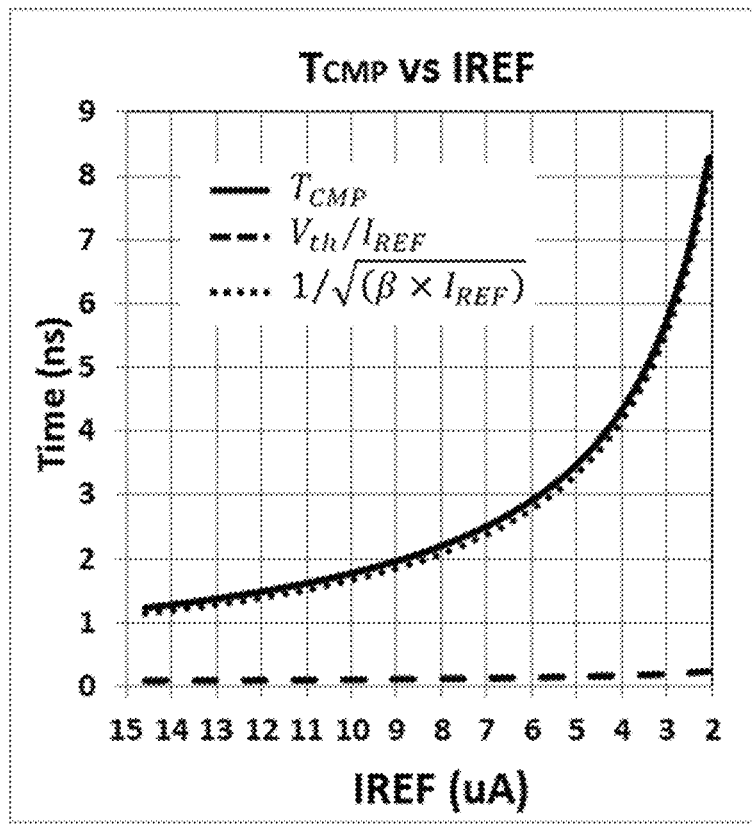
FIG. 3 is a graph illustrating output periods as a function of an adjustable reference current for a circuit like that of FIG. 1, at a fixed capacitance.

FIG. 3 is a graph of $T_{CMP}$ versus adjustable reference current IREF in microamps (µA) over a range of about 14.5 µA to 2 µA for constant capacitances on adjustable capacitors C1 and C2. Also, FIG. 3 shows an equation for determining $T_{CMP}$ according to a circuit model. The equation shows two components, a first linear factor based on the ratio of threshold voltage of a transistor divided by IREF, and a second non-linear factor that is based on the inverse of the square root of β times IREF. As seen, the time $T_{CMP}$ is a nonlinear function of the adjustable reference current IREF. FIG. 3 also shows a trace of the nonlinear factor of IREF that contributes to the delay $T_{CMP}$ and a trace of the linear factor of IREF that contributes to the delay $T_{CMP}$. As can be seen, the nonlinear factor tracks the delay $T_{CMP}$ closely in this model.

The nonlinear nature of this trace illustrates that tuning the output clock period $T_{RO}$ precisely is difficult or impractical as the nonlinear trace $T_{CMP}$ become steeper for lower reference currents and longer periods. In the example circuit modeled in FIG. 3, in the range of 14.5 µA to 6 µA, the delay $T_{CMP}$ is relatively linear as a function of IREF. In the range from 6 µA to 2 µA, however, the delay is a very steep function of IREF.

In the steep region, precise tuning of the output period of the clock would require a very fine tuning ability of the adjustable reference current IREF, because small steps in IREF result in large changes in output periods. To implement small steps in IREF using a digital parameter to set the reference current level, requires a large number of bits in the digital parameter and complex circuit structures which may not be practical in some systems.

Figure 8:
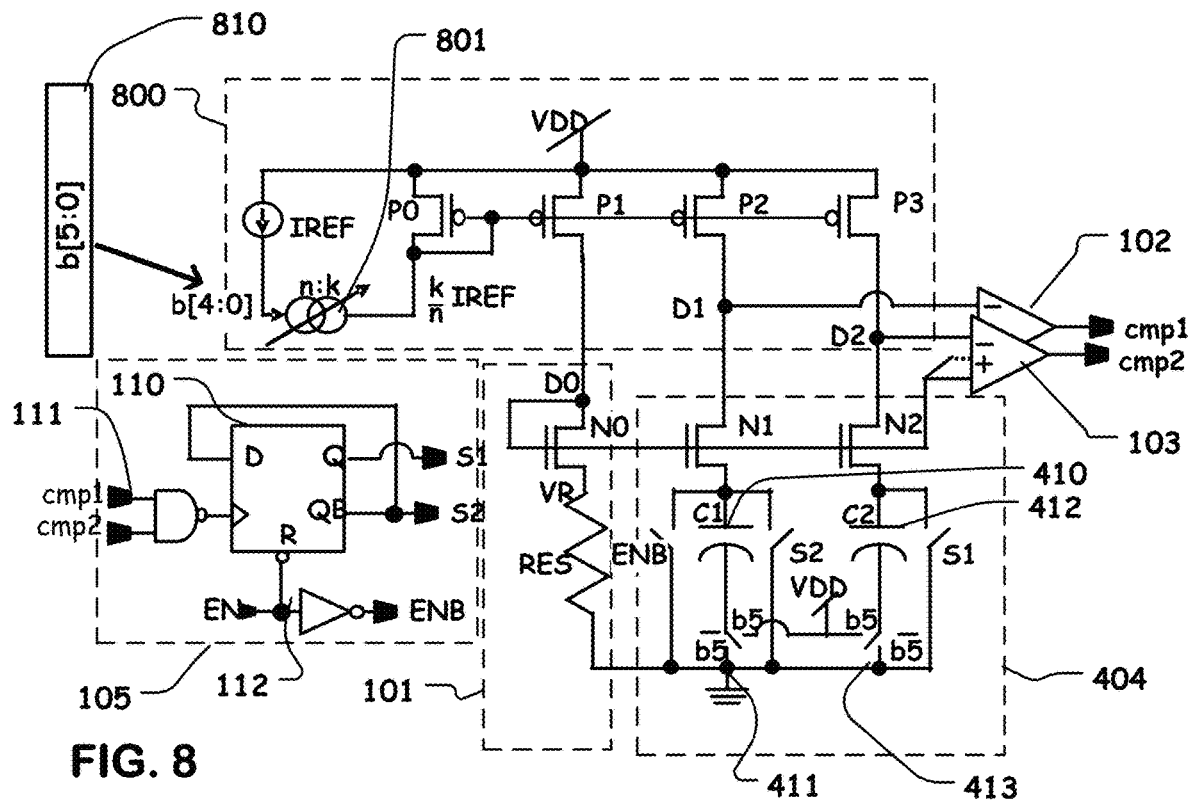
FIG. 8 is a schematic diagram of an alternative embodiment of a current mode, relaxation oscillator circuit having a tunable output period, and a digital parameter input.

Using adjustable capacitors C1 and C2 enables more precise control, by shifting the steep response regions of the graph (like the range from 6 µA to 2 µA in FIG. 3). This shifting of the graph can be accomplished by changing the capacitance for different ranges of output clock period, embodiments of which are shown in FIGS. 4 and 8.

Figure 4:
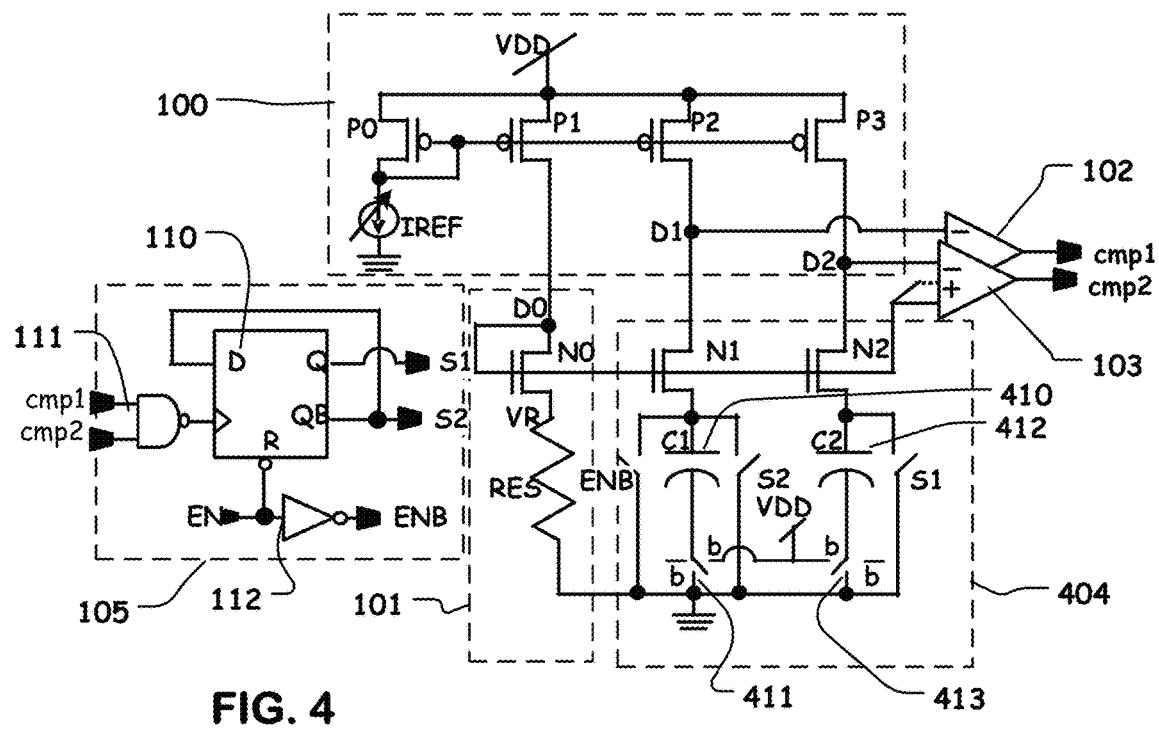
FIG. 4 is a schematic diagram of an alternative embodiment of a current mode, relaxation oscillator circuit having a tunable output period.

FIG. 4 is a schematic diagram of a relaxation oscillator like that of FIG. 1, in which the charging circuit is modified, using adjustable capacitors C1 and C2 implemented by MOS capacitors having two states. The same reference numerals are used in FIG. 4 for components like those of FIG. 1, and those components are not described again. The charging circuit 404 shown in FIG. 4 includes the transistors N1 and N2, in series with MOS capacitors C1, C2 respectively. In FIG. 4, C1 and C2 include the elements 410 and 412 connected to switch elements 411, 413 respectively, by which the second terminals of the capacitors are coupled either to VSS or to the supply potential VDD in response to the control signal b.

Figure 5:
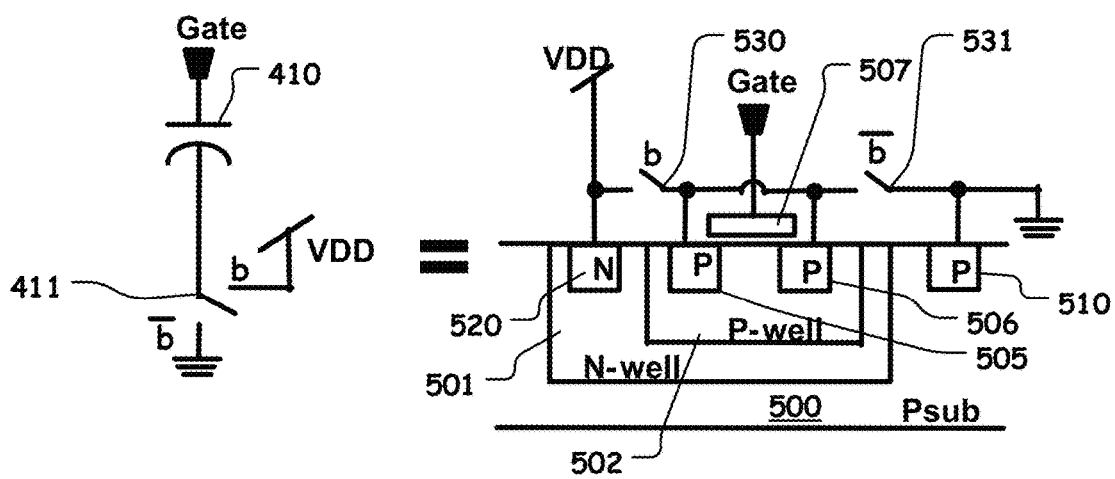
FIG. 5 illustrates an adjustable capacitor comprising a MOS capacitor.

FIG. 5 illustrates one structure of an MOS capacitor having two states. The structure represented by capacitor elements 410 and 412 of FIG. 4, and the corresponding switch elements 411 and 413, can be implemented using a MOS transistor structure as illustrated. The structure is formed in a substrate 500, typically with light p-type doping. An isolation well 501 is formed in the substrate 500, comprising an n-type doping region. A channel well 502 with p-type doping is disposed inside the isolation well 501. The substrate 500 and the isolation well 501 are biased via the contacts 510 and 520 to VSS and the supply potential VDD, for example. To form an MOS capacitor, the source and drain terminals 505, 506 are connected together and form, in combination with the channel between them, the second terminal of the capacitor. Bias voltage is applied to the source and drain terminals 505, 506, also biases the channel well 502. The first terminal of the capacitor is formed by the gate terminal 507.

Switches 530 and 531 are connected between the isolation well contact 520 and the substrate contact 510 respectively. The control signal b and its complement/b are used to control the switches 530 and 531. When the control signal complement/b is high, switch 531 closes and switch 530 opens connecting the second terminal of the capacitor to VSS. When control signal b is high, switch 530 closes and switch 531 opens, connecting the second terminal of the capacitor to the supply potential VDD.

Figure 6:
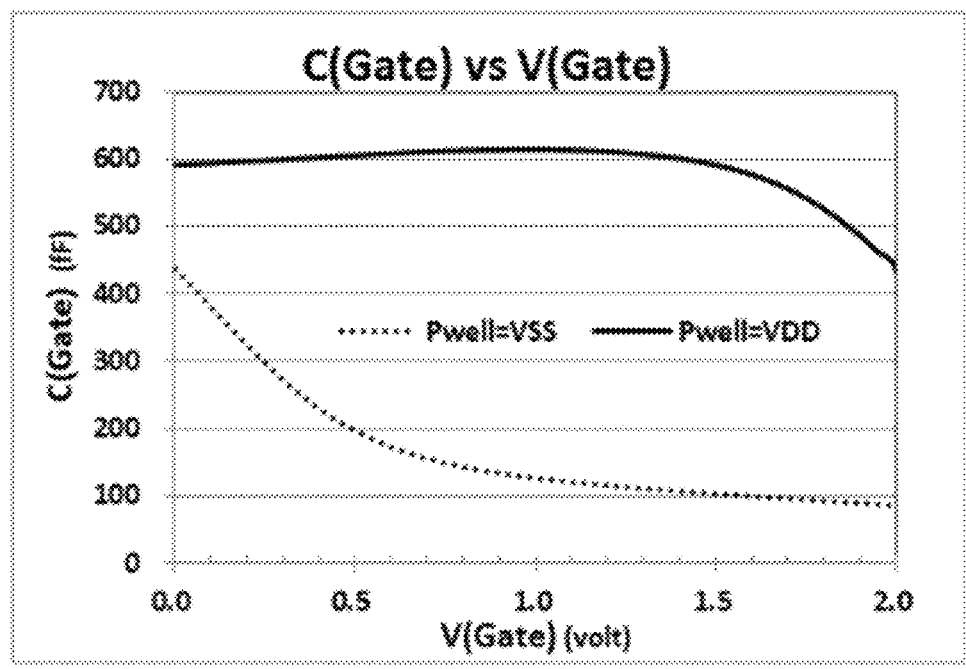
FIG. 6 is a graph of capacitance of a MOS capacitor as a function of gate voltage, and well voltage.

The capacitance of the MOS capacitors C1 and C2 in a structure like that of FIG. 5 is plotted in FIG. 6. As seen, when the channel well (Pwell in the graph) is connected to VDD, the capacitance has a first state at about 600 femto Farads when the gate voltage is between about zero and 1.5 V. When the channel well is connected to VSS, for example, the capacitance has a second state at about 100 femto farads when the gate voltage is between about 0.5 and 2 V.

Thus, by switching the bias on the source and drain terminals of the MOS capacitors, the adjustable capacitor is switchable between first and second capacitance states.

Figure 7:
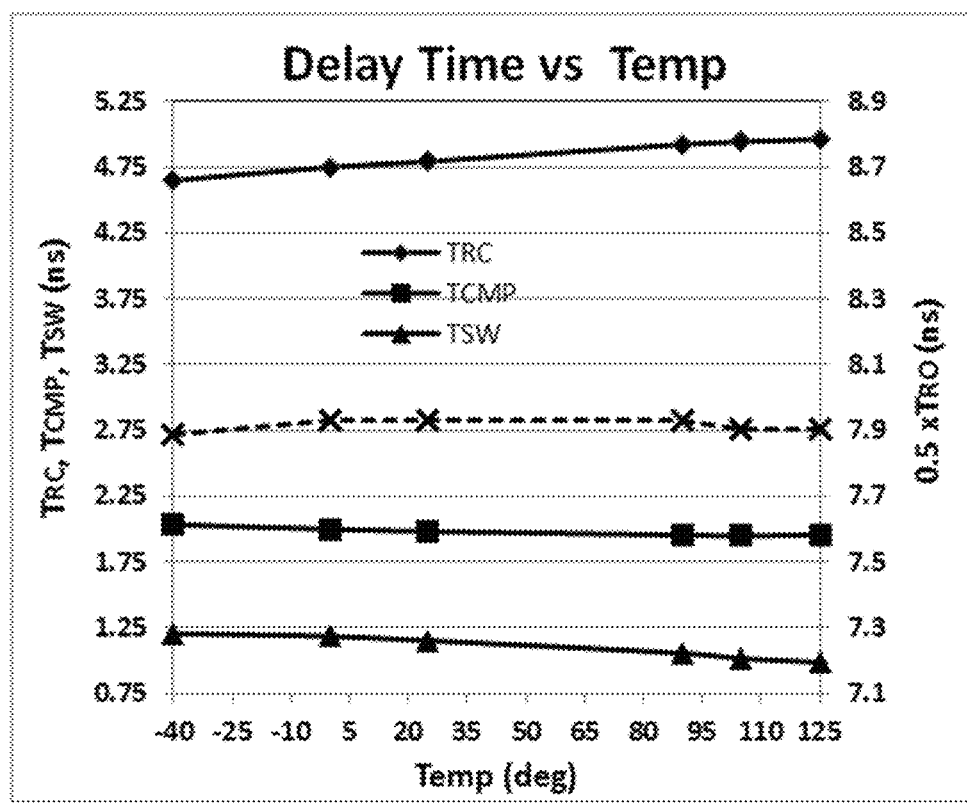
FIG. 7 is a graph showing delay time versus temperature across a range of operating temperatures for components of the circuit of FIG. 4.

FIG. 7 is a graph plotting delay components of the relaxation oscillator that contribute to the tunable period versus temperature. For a relaxation oscillator it is desirable to have a temperature coefficient TC close to zero across the desired operating range. For an example circuit, analyzed for the purposes of this graph, the component $T_{SW}$ of the delay attributable to the switching time of the control circuit when the comparator switches has a slightly negative temperature coefficient, causing the delay value to fall slightly as temperature ranges from negative 40° to positive 125° Celsius.

The component $T_{RC}$ attributable to the charging circuit while the transistor N1 or N2 is in linear mode has a slightly positive temperature coefficient, increasing slightly over the temperature range. The component $T_{CMP}$ attributable to the charging circuit while the transistor N1 or N2 is in saturation has a slightly negative temperature coefficient.

The current reference generator can be implemented in a manner that establishes the $T_{CMP}$ delay with a temperature coefficient that offsets the temperature coefficients of components $T_{SW}$ and $T_{RC}$, so that in combination the components $T_{CMP}$, $T_{SW}$ and $T_{RC}$ can have a combined temperature coefficient close to zero.

This offset is illustrated in FIG. 7 by the plot of the half-period $0.5 \times T_{RO}$ of the relaxation oscillator labeled on the plot using the "x" marks, which is shown to be substantially constant at about 7.9 ns over the plotted range of temperature, where substantially constant for these purposes means varying less than 10% over the operating range of temperatures from negative 40° to positive 125° Celsius.

Thus, embodiments of the present invention include an adjustable reference current generator tuned by adjusting components in the circuit, for a temperature coefficient which offsets the combined temperature coefficients of the balance of the relaxation oscillator ($T_{SW}$ and $T_{CMP}$) in order to achieve a very low temperature coefficient.

FIG. 8 is a schematic diagram of a relaxation oscillator like that of FIG. 4, in which the adjustable reference current generator 800 is modified using an adjustable reference current IREF, which in the illustrated embodiment comprises a digitally adjustable current mirror circuit 801. The same reference numerals are used in FIG. 8 for components like those of FIG. 4, and those components are not described again. The adjustable reference current generator 800 shown in FIG. 8 includes a digitally adjustable current mirror circuit 801 that provides an output k/n IREF, where n is a constant factor of the adjustable reference current IREF, and k is a digitally controlled parameter of the output of the digitally adjustable current mirror circuit 801. Other types of digitally adjustable reference current generators can be utilized as well.

Also illustrated schematically in FIG. 8 is a control register 810 which can be implemented on the same integrated circuit as the relaxation oscillator circuit, which applies the control signals b[5:0] to set the output clock period.

Control register 810 can comprise nonvolatile memory, and write-once memory in some embodiments. In other embodiments, the control register 810 can be volatile memory such as SRAM. In some embodiments, the control register 810 is changeable in the field by writing the control register 810 to change one or more bits of the parameter b[5:0].

In this embodiment, the output k/n IREF has a magnitude that is set by the control signals b[4:0]. Five bits of control establishes 32 steps of the adjustable reference current IREF.

The capacitance of the adjustable capacitors C1 and C2 are set by the control signal b[5] in this embodiment for two capacitance states which, in combination with the 32 steps set by the adjustable reference current generator, establishes 64 tunable settings for the relaxation oscillator.

In other embodiments, the adjustable capacitors can be implemented using a set of passive capacitors that are adjusted using switches. Also, other types of adjustable capacitors can be utilized. In this embodiment, only two states of the adjustable capacitor are utilized. In other embodiments, more than two states can be implemented to establish a desired range of tuning for the relaxation oscillator.

Figure 9:
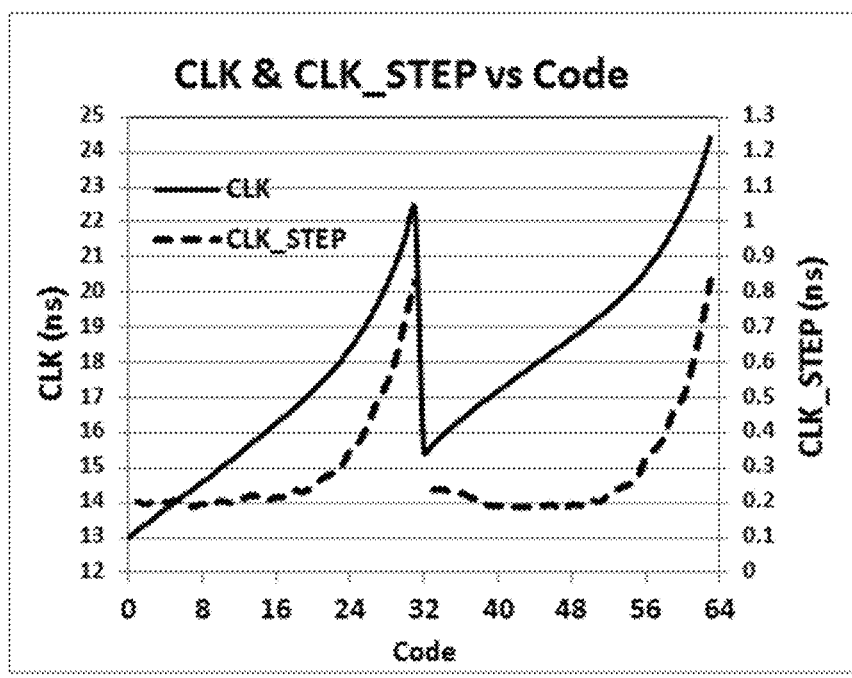
FIG. 9 is a graph of clock periods and clock steps, versus input digital parameter for a circuit like that of FIG. 8.

FIG. 9 is a graph showing the output clock period CLK and the adjustment step CLK_STEP verses the setting of the parameter b[5:0] from 0 to 63 in a representative implementation.

In a first range, with the parameters set between zero and 24 (b5=0), the clock step remains relatively constant at about 0.2 nanoseconds per step of the parameter, and the clock period increases linearly. In the range of the code from about 25 to 31, it is seen that the clock step increases dramatically, and the clock period also begins to change in the nonlinear fashion.

In a second range, with the parameters set between 32 and about 56, the clock step remains relatively constant at about 0.2 nanoseconds, and the clock period increases linearly. For parameter settings above 56, the clock step size increases dramatically, and the clock period also begins to change in nonlinear fashion.

To implement an embodiment with relatively constant step sizes across a range of output clock periods of 13 to 21 ns, a parameter register can be set to code values between 0 and 20 (b5 is 0) to set an output period between 13 and 17 ns, and set to code values between 40 and 56 (b5 is 1) to set an output period between 17 and 21 ns. Code values between 21 and 39 and between 57 and 63 may be omitted, because they result in operation of the circuit in non-linear tuning steps.

FIG. 9 is a graph showing the output clock period CLK and the adjustment step CLK_STEP verses the setting of the parameter b[5:0] from 0 to 63 in a representative implementation.

Figure 10:
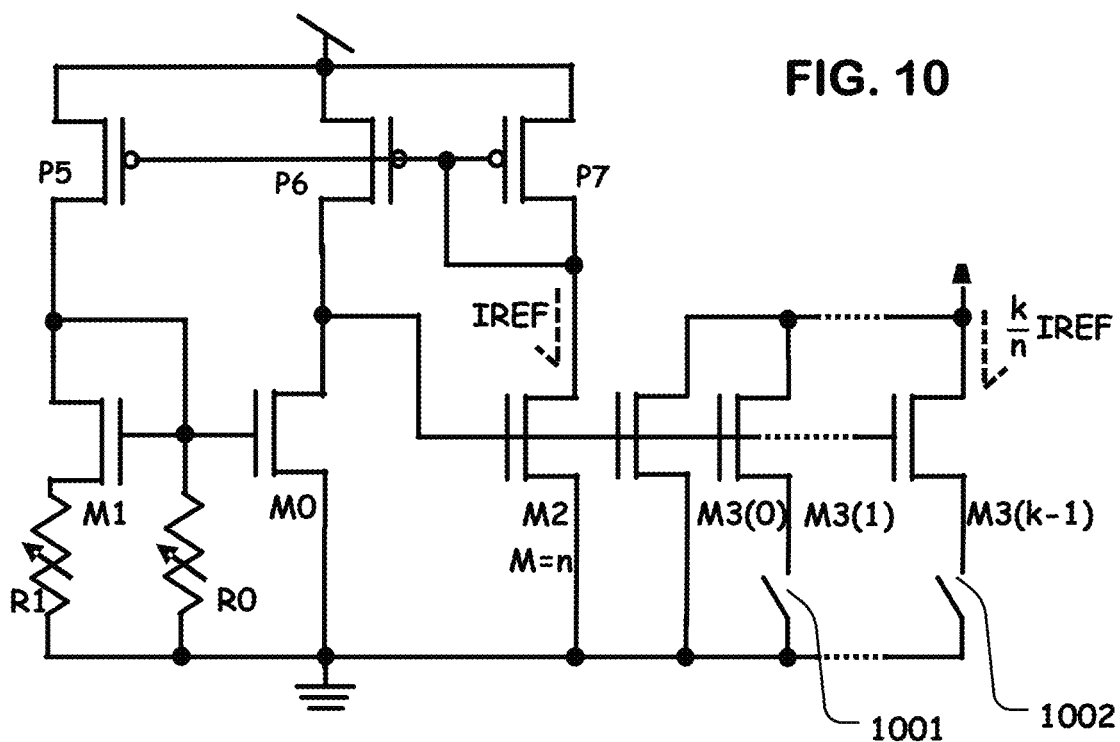
FIG. 10 is a schematic diagram of a tunable reference current generator suitable for use in the circuit of FIG. 8.

FIG. 10 is a schematic diagram of an adjustable reference current generator suitable for use in the circuit of FIG. 8, which can be tuned to have a temperature coefficient that offsets the temperature coefficients of other components of the relaxation oscillator, resulting in an overall temperature coefficient close to zero.

In this embodiment, p-channel MOS transistors P5, P6 and P7 have sources connected to the supply potential VDD and gates connected together. Also, the gate of transistor P7 is connected to the drain of transistor P7. The drains of the transistors P5, P6 and P7 are connected to the drains of n-channel transistors M1, M0 and M2, respectively. The gates of transistors M1 and M0 are connected together, and to the drain of transistor M1. Also, the drain of transistor M0 is connected to the gate transistor M2. The source of transistor M0 and the source of transistor M2 are connected to VSS. The source of transistor M1 is connected to an adjustable resistor R1. The gates of transistors M0 and M1 are connected via adjustable resistor R0 to VSS.

The circuit results in generation of an adjustable reference current IREF at the drain of transistor P7 through transistor M2, having a temperature coefficient TC that can be adjusted by adjusting the values of the resistors R0 and R1.

The adjustable reference current generator of FIG. 10 has a component that is complementary to absolute temperature CTAT generated based on the gate-to-source voltage of transistor M0 and the resistor R0 ($V_{GS\_M0}/R0$), and a component that is proportional to absolute temperature PTAT based on the difference in gate-to-source voltages of transistors M0 and M1, and the value of the resistor R1 ($\Delta V_{GS(M0,M1)}/R1$). Negative feedback via transistors M0, M1 and M2 hold the CTAT and PTAT operation.

In this circuit, an output current k/n IREF is generated using a tunable current mirror circuit that comprises transistors M3(0) to M3(k−1). For example, each of the transistors M3(0) to M3(k−1) can have a transistor width equal to the transistor width of transistor M2. In this case, the output current k/n IREF is a multiple of the IREF in M2 determined by the number of the switches 1001, 1002 that are opened or closed. This relationship of the output current to the adjustable reference current IREF can be set as desired in a given implementation, using various combinations of sizes of the transistors and the control signals.

Thus, the output current k/n IREF can be tuned using a digital parameter as discussed with respect to FIG. 8.

The temperature coefficient of this circuit is a function of the resistances R0 and R1. The values of R0 and R1 can be determined for a particular implementation by testing, using an adjustable resistor and varying the resistance to find the desired result. Alternatively, the values can be determined by simulation or other technique.

Figure 10A:
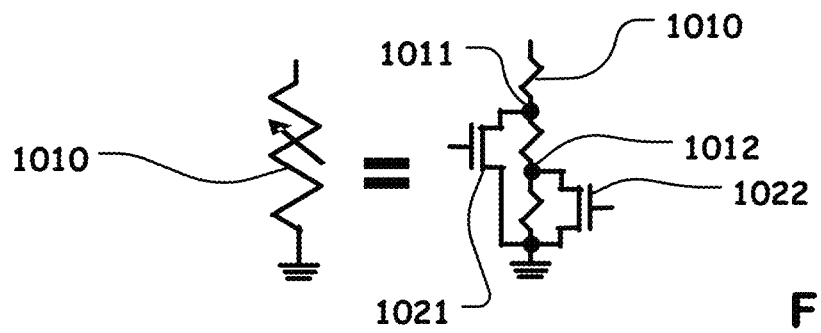
FIG. 10A is a schematic diagram of an adjustable resistor usable to control the temperature coefficient in the circuit of FIG. 10.

FIG. 10A illustrates an embodiment of an adjustable resistor that can be used in testing to find appropriate settings. In this embodiment, the adjustable resistor comprises a resistive strip 1010 connected to VSS, and having a plurality of taps 1011, 1012. Also, transistors 1021 and 1022 are connected from VSS to corresponding taps along the resistor. The resistance value can be set by establishing the values on the gates of the transistors.

In a model described herein, using resistances R0=252K and R1=23K, a slightly negative temperature coefficient is achieved which can be applied to offset the temperature coefficients of other components of the relaxation oscillator as discussed above.

Figure 11:
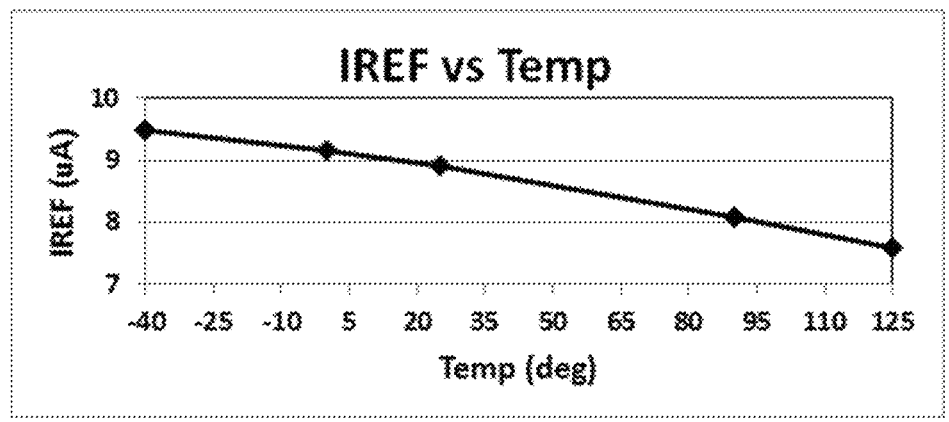
FIG. 11 is a graph of an adjustable reference current versus temperature for a circuit like that of FIG. 10, showing a negative temperature coefficient.

FIG. 11 is a graph of an adjustable reference current IREF versus temperature for this embodiment, illustrating that the adjustable reference current IREF falls slightly with temperature across the temperature range from −40° to +125° C.

Figure 12:
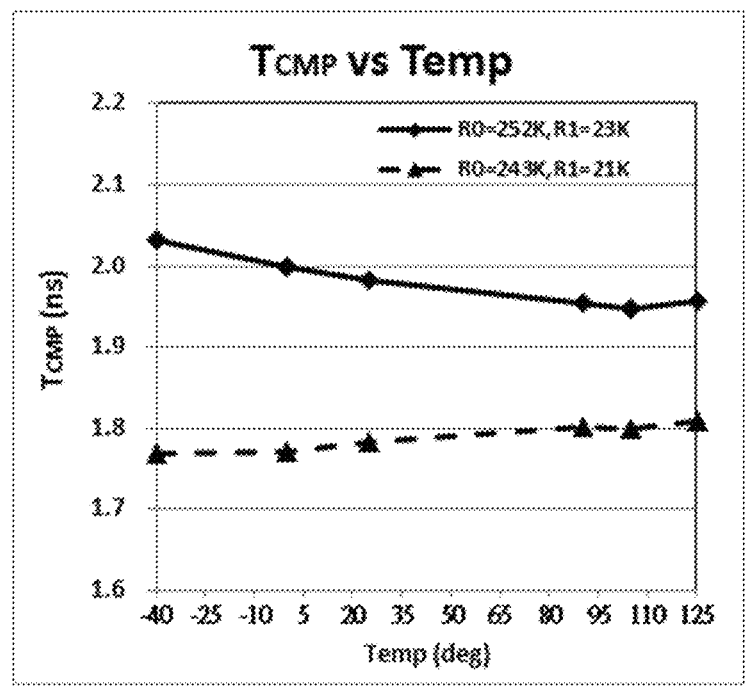
FIG. 12 is a graph showing delay versus temperature of a comparator circuit for the circuit of FIG. 8.

FIG. 12 illustrates, for the purposes of comparison, the delay parameter $T_{CMP}$ versus temperature for the selected embodiment in which R0=252K and R1=23K, and for an alternative embodiment in which R0=243K and R1=21K used in the testing operations. As illustrated, the alternative embodiment has a slightly positive temperature coefficient, while the selected embodiment has a slightly negative temperature coefficient.

Figure 13:
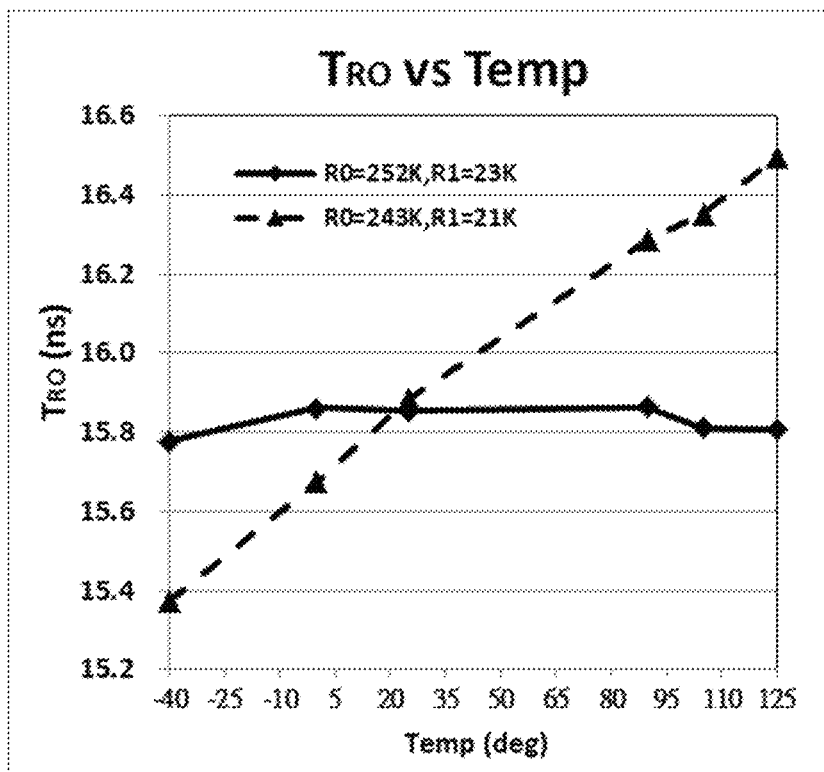
FIG. 13 is a graph of the delay of the relaxation oscillator versus temperature for a circuit like that of FIG. 8.

FIG. 13 illustrates the impact of using the different embodiments plotted in FIG. 12, on the period of the output clock for the relaxation oscillator. As seen, for the embodiment in which R0=252K and R1=23K, the output period remains substantially constant across the temperature range, varying by less than 0.1 ns. However, for the other embodiment in which R0=243K and R1=21K, the output period changes by over 1 ns across the temperature range.

Figure 14:
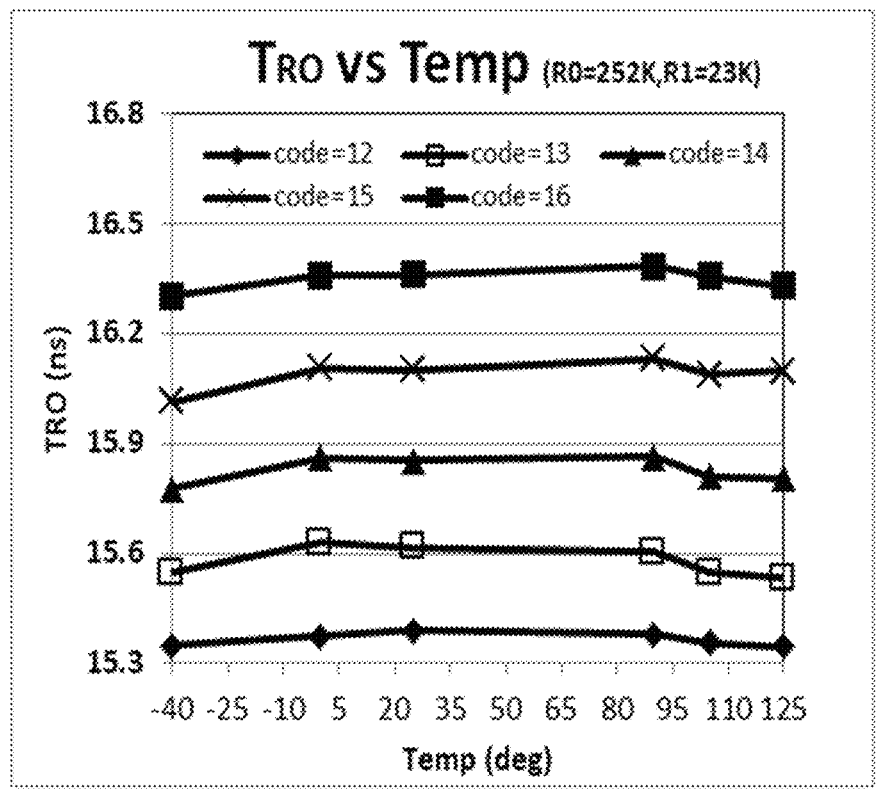
FIG. 14 illustrates delay of the relaxation oscillator versus temperature for multiple settings of the adjustable reference current.

FIG. 14 is a plot showing the results of simulation the circuit of FIG. 10 at a plurality of output period settings. As seen in the plot, each of the settings has a substantially constant period $T_{RO}$ across the entire temperature range. Though some constant period $T_{RO}$ from 15.39 ns to 16.36 ns for code=12 to code=16 and all with R0=252K and R1=23K has been demonstrated. The same holds true for the entire tunable range while the adjustable resistor R0 and R1 might be tuned to generate the desired result.

The relaxation oscillator is described that can be tuned across a broad range of output clock periods, and can be implemented in a manner that establishes a low temperature coefficient across a broad range of temperature for a range of output clock periods.

A relaxation oscillator that can be tuned while maintaining a low temperature coefficient is provided, increasing the flexibility and range of applications in which this type of oscillator can be utilized.

The tunable relaxation oscillator described herein can be used in a variety of integrated circuit devices, including integrated circuit memory devices, microcontrollers, mixed-signal integrated circuits, system-on-a-chip SoC devices, application-specific integrated circuits, field programmable gate arrays, microprocessors, and others devices that require accurate clock periods.

While the present invention is disclosed by reference to the preferred embodiments and examples detailed above, it is to be understood that these embodiments and examples are intended in an illustrative rather than in a limiting sense. It is contemplated that modifications and combinations will readily occur to those skilled in the art, which modifications and combinations will be within the spirit of the invention and the scope of the following claims.

What is claimed is:
1. An oscillator, comprising:
an adjustable reference current generator to produce an adjustable reference current;
a charging circuit, including an adjustable capacitor, to charge a capacitive node as a function of the reference current and a capacitance of the adjustable capacitor operatively coupled to the capacitive node;
a comparator having inputs operatively coupled to a reference voltage node and to the capacitive node, generating a comparator output; and
a control circuit to alternately enable the charging circuit to charge the capacitive node and to discharge the capacitive node in response to changes in the comparator output, and to provide an oscillator output signal having oscillator periods variable as a function of the adjustable capacitance and the adjustable reference current, wherein
the adjustable capacitor comprises a switchable MOS capacitor having a gate connected to a first capacitor terminal and source and drain terminals connected to a second capacitor terminal, and a switch responsive to an input signal to connect the second capacitor terminal to a first voltage to set a first capacitance state for setting the oscillator periods in a first range, or to a second voltage to set a second capacitance state for setting the oscillator periods in a second range.

2. The oscillator of claim 1, wherein the adjustable reference current generator and adjustable capacitor are adjustable in response to a digital parameter, the digital parameter including said input signal.

3. The oscillator of claim 1, wherein the adjustable reference current generator and the control circuit have respective temperature coefficients, and the temperature coefficient of the adjustable reference current generator offsets the temperature coefficient of the control circuit.

4. The oscillator of claim 1, wherein the adjustable reference current generator comprises a current mirror circuit having a plurality of outputs which produce respective currents having different magnitudes, and switches responsive to an input parameter to enable and disable selected ones of the plurality of outputs.

5. The oscillator of claim 1, wherein the adjustable reference current generator comprises a plurality of outputs which produce respective currents having different magnitudes, and switches responsive to an input parameter to enable and disable selected ones of the plurality of outputs.

6. The oscillator of claim 1, including a reference voltage generator to generate the reference voltage as a function of the reference current and a resistance.

7. The oscillator of claim 1, including a register providing input to the reference current generator to set the magnitude of the adjustable reference current, and the input signal to the adjustable capacitor to set the state of the adjustable capacitor.

8. The oscillator of claim 1, wherein the adjustable reference current generator and the control circuit have respective temperature coefficients, and the temperature coefficient of the adjustable reference current generator offsets the temperature coefficient of the control circuit.

9. An oscillator, comprising:
an adjustable reference current generator to produce an adjustable reference current;
a charging circuit to charge a first capacitive node as a function of the reference current and a first capacitance of a first adjustable capacitor operatively coupled to the first capacitive node, and to charge a second capacitive node as a function of the reference current and a second capacitance of a second adjustable capacitor operatively coupled to the first capacitive node;
a first comparator having inputs operatively coupled to a reference voltage node and to the first capacitive node, generating a first comparator output;
a second comparator having inputs operatively coupled to the reference voltage node and to the second capacitive node, generating a second comparator output; and
a control circuit to alternately enable the charging circuit to charge and discharge the first capacitive node and to charge and discharge the second capacitive node in response to changes in the first and second comparator outputs, and to provide an oscillator output signal having an oscillator period variable as a function of the first and second adjustable capacitances and the adjustable reference current, wherein
the first and second adjustable capacitors comprise respective switchable MOS capacitors, the switchable MOS capacitors each having a gate connected to a first capacitor terminal and source and drain terminals connected to a second capacitor terminal, and a switch responsive to a corresponding input signal to connect the second capacitor terminal to a first voltage to set a first capacitance state for setting the oscillator periods in a first range, or to a second voltage to set a second capacitance state for setting the oscillator periods in a second range.

10. The oscillator of claim 9, wherein the adjustable reference current generator and the first and second adjustable capacitors are adjustable in response to a digital parameter, the digital parameter including said corresponding input signals.

11. The oscillator of claim 9, wherein the adjustable reference current generator and the control circuit have respective temperature coefficients, and the temperature coefficient of the adjustable reference current generator offsets the temperature coefficient of the control circuit.

12. The oscillator of claim 9, wherein the adjustable reference current generator comprises a current mirror circuit having a plurality of outputs which produce respective currents having different magnitudes, and switches responsive to a programmable parameter to enable and disable selected ones of the plurality of outputs.

13. The oscillator of claim 9, wherein the adjustable reference current generator comprises a plurality of outputs which produce respective currents having different magnitudes, and switches responsive to a programmable parameter to enable and disable selected ones of the plurality of outputs.

14. The oscillator of claim 9, including a reference voltage generator to generate the reference voltage as a function of the reference current and a resistance.

15. The oscillator of claim 9, including a register providing input to the reference current generator to set the magnitude of the adjustable reference current, and the corresponding input signals to the first and second adjustable capacitors to set the capacitances.

16. The oscillator of claim 9, wherein the adjustable reference current generator and the control circuit have respective temperature coefficients, and the temperature coefficient of the adjustable reference current generator offsets the temperature coefficient of the control circuit.

* * * * *